(12) United States Patent
Lee et al.

(10) Patent No.: US 11,679,527 B2
(45) Date of Patent: Jun. 20, 2023

(54) MANUFACTURING METHOD OF CERAMIC CHIPS

(71) Applicant: ROOTS Co., Ltd., Incheon (KR)

(72) Inventors: Sung Yoon Lee, Incheon (KR); Soon Min Kim, Incheon (KR); Jong Woo Ha, Seoul (KR)

(73) Assignee: ROOTS CO., LTD., Incheon (KR)

( * ) Notice: Subject to any disclaimer, the term of this patent is extended or adjusted under 35 U.S.C. 154(b) by 390 days.

(21) Appl. No.: 17/007,310

(22) Filed: Aug. 31, 2020

(65) Prior Publication Data
US 2021/0122083 A1   Apr. 29, 2021

(30) Foreign Application Priority Data
Oct. 28, 2019 (KR) .......................... 10-2019-0134809

(51) Int. Cl.
| | | |
|---|---|---|
| *B28B 11/08* | (2006.01) | |
| *B28B 11/00* | (2006.01) | |
| *H01L 33/50* | (2010.01) | |

(52) U.S. Cl.
CPC ........ *B28B 11/0845* (2013.01); *B28B 11/003* (2013.01); *H01L 33/505* (2013.01); *H01L 2933/0041* (2013.01)

(58) Field of Classification Search
CPC ............... H01L 21/3043; H01L 21/304; H01L 2933/0041
See application file for complete search history.

(56) References Cited

U.S. PATENT DOCUMENTS

| | | | | |
|---|---|---|---|---|
| 4,722,130 A | * | 2/1988 | Kimura .................. | H01L 24/27 257/E29.022 |
| 4,904,610 A | * | 2/1990 | Shyr ....................... | H01L 21/78 257/E29.022 |
| 5,888,883 A | * | 3/1999 | Sasaki ................. | H01L 21/6835 438/464 |
| 6,399,464 B1 | * | 6/2002 | Muntifering ........ | H01L 21/6835 438/459 |
| 6,448,151 B2 | * | 9/2002 | Tateishi ................ | B28D 5/022 438/460 |
| 6,569,343 B1 | * | 5/2003 | Suzuki ................... | B41J 2/1631 216/2 |
| 6,680,241 B2 | * | 1/2004 | Okamoto ............ | H01L 21/6835 438/464 |
| 6,699,774 B2 | * | 3/2004 | Takyu ..................... | H01L 21/78 438/460 |

(Continued)

FOREIGN PATENT DOCUMENTS

| | | |
|---|---|---|
| KR | 10-2016-0126059 A | 11/2016 |
| KR | 10-2017-0013154 A | 2/2017 |

*Primary Examiner* — Andrew J Coughlin
(74) *Attorney, Agent, or Firm* — Hauptman Ham, LLP

(57) ABSTRACT

A method of manufacturing ceramic chips according to one aspect of the present disclosure includes: (A) forming a plurality of dicing trenches on a ceramic wafer; (B) removing a surface in which the dicing trenches are formed by as much as a predetermined thickness to eliminate a rough surface, which is formed on an outer side of each of the dicing trenches when the dicing trenches are formed; and (C) removing a surface opposite to the surface in which the dicing trenches are formed by as much as a predetermined thickness so that the wafer is individualized into a plurality of ceramic chips.

6 Claims, 6 Drawing Sheets

(56) References Cited

U.S. PATENT DOCUMENTS

| | | | |
|---|---|---|---|
| 6,756,288 B1* | 6/2004 | Feil | H01L 25/50 |
| | | | 257/E21.705 |
| 7,217,640 B2* | 5/2007 | Kurosawa | H01L 21/78 |
| | | | 438/460 |
| 9,666,771 B2* | 5/2017 | Schricker | H01L 33/507 |
| 2001/0055856 A1* | 12/2001 | Tao | H01L 23/49575 |
| | | | 257/E29.022 |
| 2009/0173885 A1* | 7/2009 | Zeitler | G01T 1/202 |
| | | | 438/69 |
| 2010/0015782 A1* | 1/2010 | Yu | H01L 21/78 |
| | | | 257/E21.001 |
| 2010/0081235 A1* | 4/2010 | Furumura | G06K 19/07775 |
| | | | 257/E21.599 |

\* cited by examiner

MANUFACTURING METHOD OF CERAMIC CHIPS

CROSS-REFERENCE TO RELATED APPLICATION

This application claims priority to and the benefit of Korean Patent Application No. 10-2019-0134809, filed on Oct. 28, 2019, the entire contents of which are incorporated herein by reference.

BACKGROUND OF THE INVENTION

(a) Field of the Invention

The present disclosure relates to a method of manufacturing ceramic chips. More particularly, the present disclosure relates to a method of dividing a large-sized ceramic wafer into individual chips of a small size when manufacturing ceramic chips such as color conversion members that change the wavelength of light emitted from a light-emitting diode (LED) chip.

(b) Description of the Related Art

Japanese Patent Publication No. 2009-96653 (published on May 7, 2009), which is a prior art document, discloses a method of manufacturing a color conversion member. The color conversion member is attached to a front side of a light-emitting diode (LED) chip to convert the wavelength of light emitted from the LED chip. When a fluorescent layer is applied as a color conversion member to a blue LED, a white light can be obtained.

In the prior art document, processes including a process of mixing glass powder and phosphor powder, a molding process, a sintering process, a pressing process, a postprocessing, and the like are disclosed as one of the various methods of manufacturing a color conversion member (see FIG. 1 of the prior art document).

Generally, a color conversion member is manufactured in the form of a thin and wide plate and then is divided into a plurality of small-sized ceramic chips in a post-processing process. This is because manufacturing a wide ceramic wafer and dividing the wafer into a plurality of chips is more advantageous in reducing material, time, and processes required to manufacture ceramic chips than directly manufacturing the ceramic chips of a required size.

A dicing machine is usually used to cut a wafer into ceramic chips of a required size. A rotating dicing blade is installed on the dicing machine. When an outer edge of the dicing blade moves so as to dig into the wafer while the dicing blade is rotating, cutting is performed. The dicing blade may move along a straight or curved path so that ceramic chips having a desired shape are formed from the wafer.

Here, a portion of the wafer is cut while being fragments as the friction between the dicing blade and the ceramic wafer occurs. This is because the color conversion member is generally obtained by bonding a plurality of small particles. Accordingly, as illustrated in FIG. 4A, a finely fragmented phenomenon occurs in which an outer peripheral surface of the cut ceramic chip is formed to be rough.

This may cause a problem when a color conversion member 55 in the form of a ceramic chip is packaged together with an LED chip 52. As illustrated in FIG. 5, a typical LED light-emitting member 50 includes the LED chip 52 installed on a printed circuit board (PCB) 51, the color conversion member (ceramic chip) 55 installed on a front side of the LED chip 52 to convert light of the LED chip 52, and a holding member 53 for fixing the color conversion member (ceramic chip) 55 and the LED chip 52 to the PCB 51. A fluorescent layer that allows a blue LED to be used as a white LED is widely used as the color conversion member (ceramic chip) 55.

The holding member 53 supports side surfaces of the ceramic chip 55 and the LED chip 52, and the ceramic chip 55 is exposed through an opening formed at one side of the holding member 53. Since an outer periphery of the side surface of the ceramic chip 55 is uneven as described above with reference to FIG. 4A, fine gaps 58 may be formed between the holding member 53 and the ceramic chip 55. When the LED light-emitting member 50 is turned on, the LED chip 52 emits light, and the light is radiated to the outside through the ceramic chip 55. However, since the gaps 58 are formed between the holding member 53 and the ceramic chip 55, the light may be scattered and a significant amount of light energy may be concentrated through the gaps 58.

Accordingly, a space between the holding member 53 and the ceramic chip 55 may be overheated and subjected to a rapid temperature change. Although $TiO_2$ having high stability is generally used as the holding member 53, cracks 59 may be generated on an inner side surface of the holding member 53 when the above-described phenomenon is continued. Due to the finely fragmented phenomenon generated at the side surface of the ceramic chip 55 during cutting of the ceramic chip 55, problems may occur in the durability and reliability of the entire LED light-emitting member 50, and furthermore, problems may also occur in which the performance of an optical system, in which the LED light-emitting member 50 is installed, is deteriorated.

PRIOR-ART DOCUMENTS

Patent Documents

Japanese Patent Publication No. 2009-96653 (published on May 7, 2009)

SUMMARY OF THE INVENTION

An embodiment of the present disclosure is directed to providing a method of manufacturing ceramic chips which allows a light-emitting diode (LED) light-emitting member, in which a color conversion member (a ceramic chip, a phosphor) is installed, to have high reliability and durability by smoothly cutting a side surface of the color conversion member.

According to an aspect of the present disclosure, there is provided a method of manufacturing ceramic chips including: (A) forming a plurality of dicing trenches on a ceramic wafer; (B) removing a surface in which the dicing trenches are formed by as much as a predetermined thickness to eliminate a rough surface, which is formed on an outer side of each of the dicing trenches when the dicing trenches are formed; and (C) removing a surface opposite to the surface in which the dicing trenches are formed by as much as a predetermined thickness so that the wafer is individualized into a plurality of ceramic chips.

Before the operation (A) of forming the plurality of dicing trenches on the ceramic wafer, a rough grinding operation may be performed on a top side of the ceramic wafer, in which the dicing trenches are to be formed.

Before the operation (A) of forming the plurality of dicing trenches on the ceramic wafer, a rough grinding operation may be performed on a bottom side of the ceramic wafer.

After the operation (B) of removing the surface in which the dicing trenches are formed by as much as a predetermined thickness to eliminate the rough surface, which is formed on the outer side of each of the dicing trenches when the dicing trenches are formed, a fine grinding operation of smoothing the surface may be performed by removing the surface in which the dicing trenches are formed once again by as much as a predetermined thickness.

After the operation (C) of removing the surface opposite to the surface in which the dicing trenches are formed by as much as a predetermined thickness so that the wafer is individualized into the plurality of ceramic chips, a fine grinding operation of smoothing surfaces of the individualized ceramic chips may be performed.

The ceramic chips may be color conversion members for an LED, the wafer may be cut out using a dicing blade to form the dicing trenches, the surface of the wafer may be ground by as much as a predetermined thickness with a disc-shaped grinder to eliminate the rough surface formed on the outer side of each of the dicing trenches, and the opposite surface of the wafer may be ground by a predetermined thickness using the disc-shaped grinder to remove a surface opposite to the surface in which the dicing trenches are formed by as much as a predetermined thickness.

The rough surface formed on the outer side of each of the dicing trenches may include an inclined portion formed on the outer side of each of the dicing trenches to be inclined so that a width of each of the dicing trenches gradually increases.

BRIEF DESCRIPTION OF THE DRAWINGS

The above and other objects, features, and advantages of the present disclosure will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
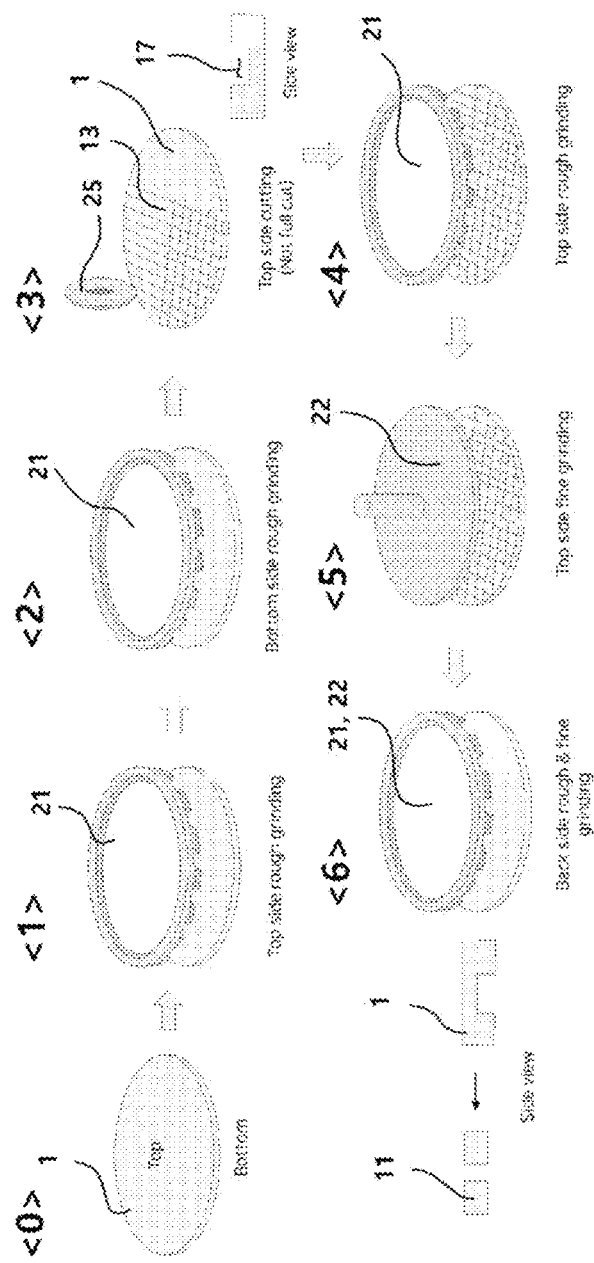
FIG. 1 is a schematic view of a method of manufacturing ceramic chips according to an embodiment of the present disclosure.

Hereinafter, an embodiment of the present disclosure will be described with reference to the accompanying drawings. The accompanying drawings illustrate exemplary forms of the present disclosure and are provided only to describe the present disclosure in more detail, and the technical scope of the present disclosure is not limited thereto.

Further, in the following description of the present disclosure, the same or similar elements are denoted by the same reference numerals and a detailed description thereof will be omitted, and the sizes and shapes of respective elements shown in the drawings may be exaggerated or reduced for convenience of description.

Meanwhile, the terms including ordinal numbers such as "first," "second," or the like can be used to describe various elements, but the elements are not limited by those terms. The terms are used merely for the purpose of distinguishing one element from another.

Figure 2:
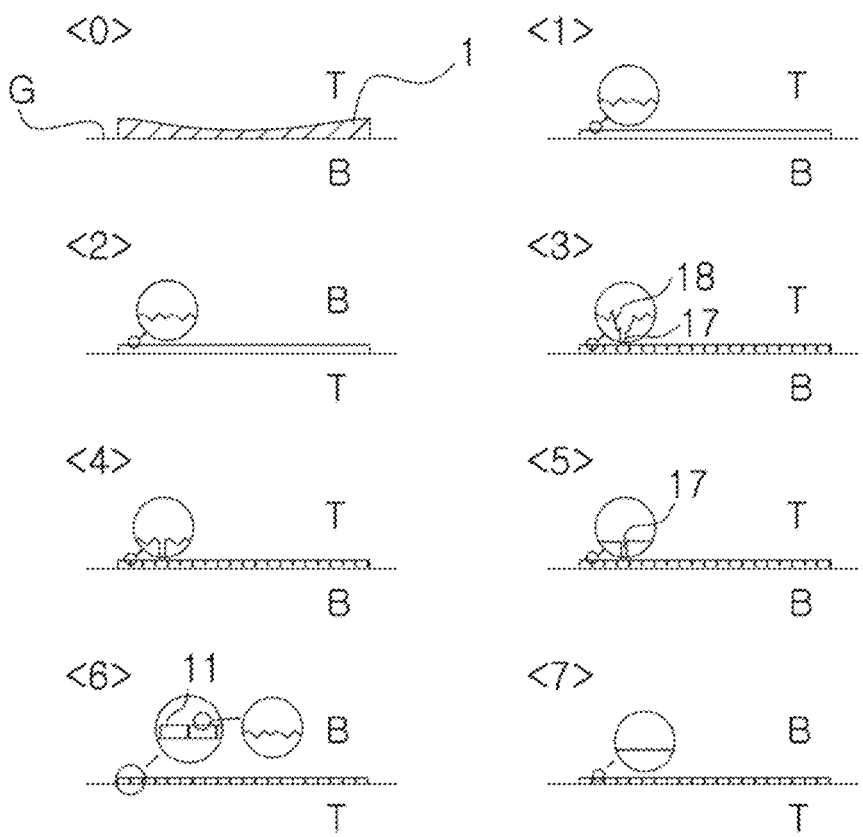
FIGS. 2 and 3 are front views illustrating ceramic chips manufactured using the method of manufacturing ceramic chips according to the embodiment of the present disclosure.
Figure 3:
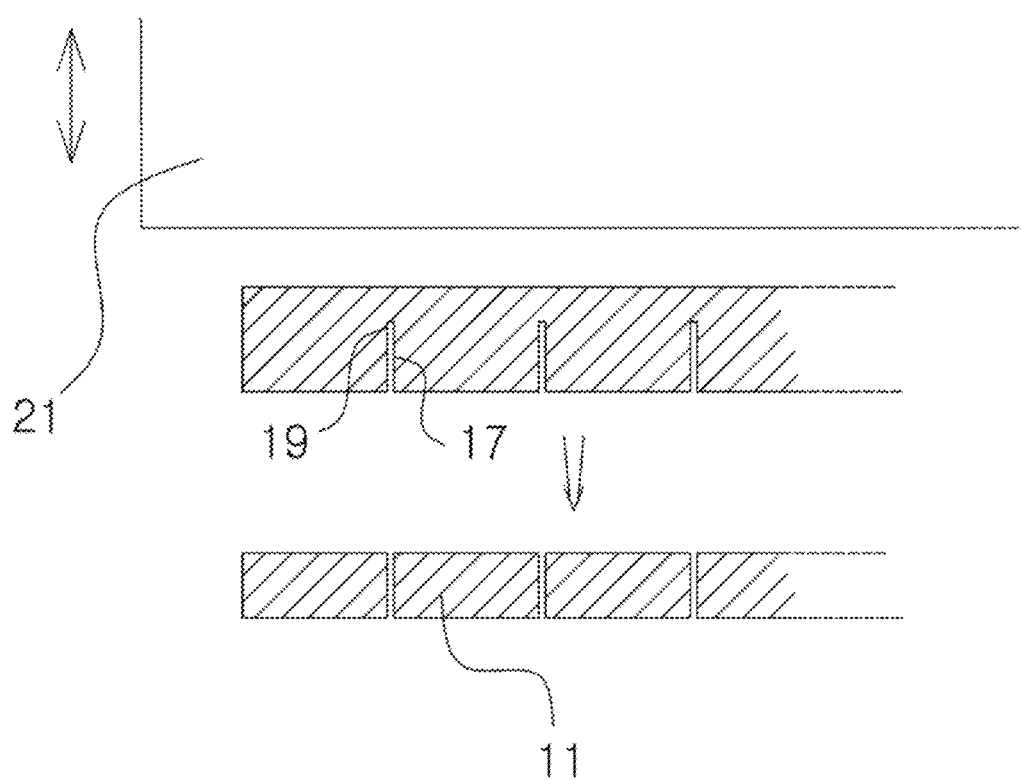
Figure 4A:
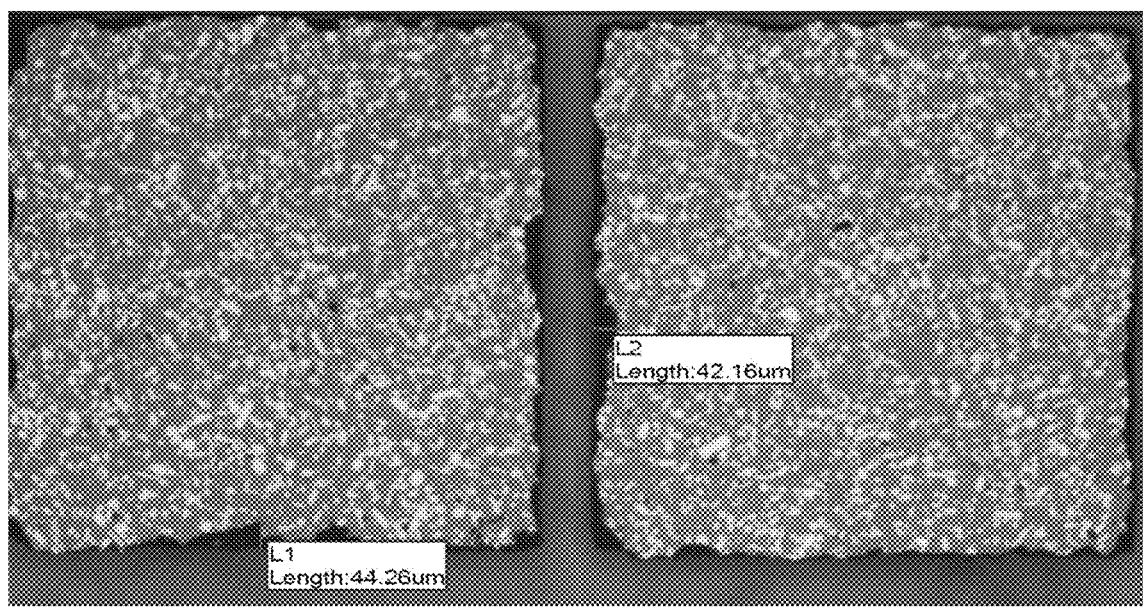
FIGS. 4A and 4B are views illustrating a comparison between a ceramic chip manufactured using a manufacturing method according to the related art and the ceramic chip manufactured using the manufacturing method according to the embodiment of the present disclosure.
Figure 4A:
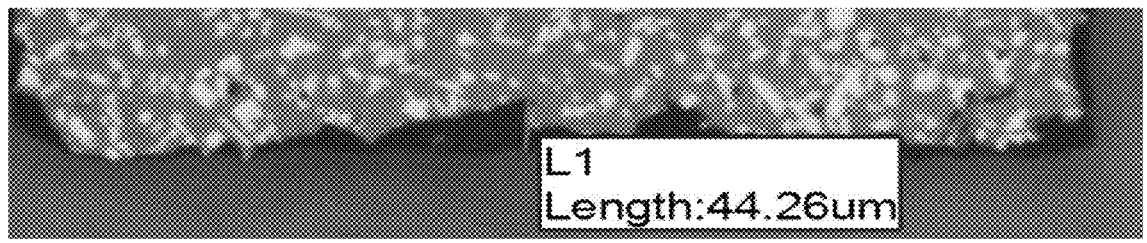
Figure 4B:
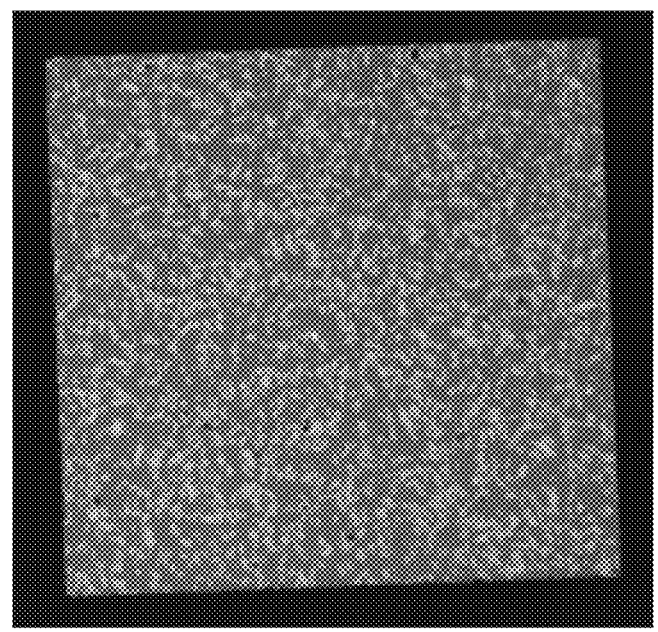
Figure 4B:
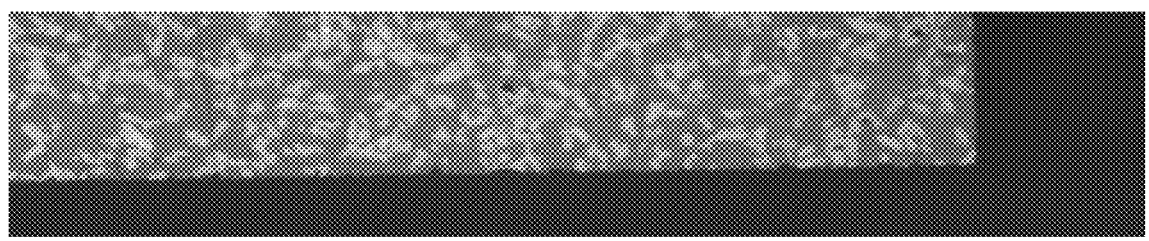
Figure 5:
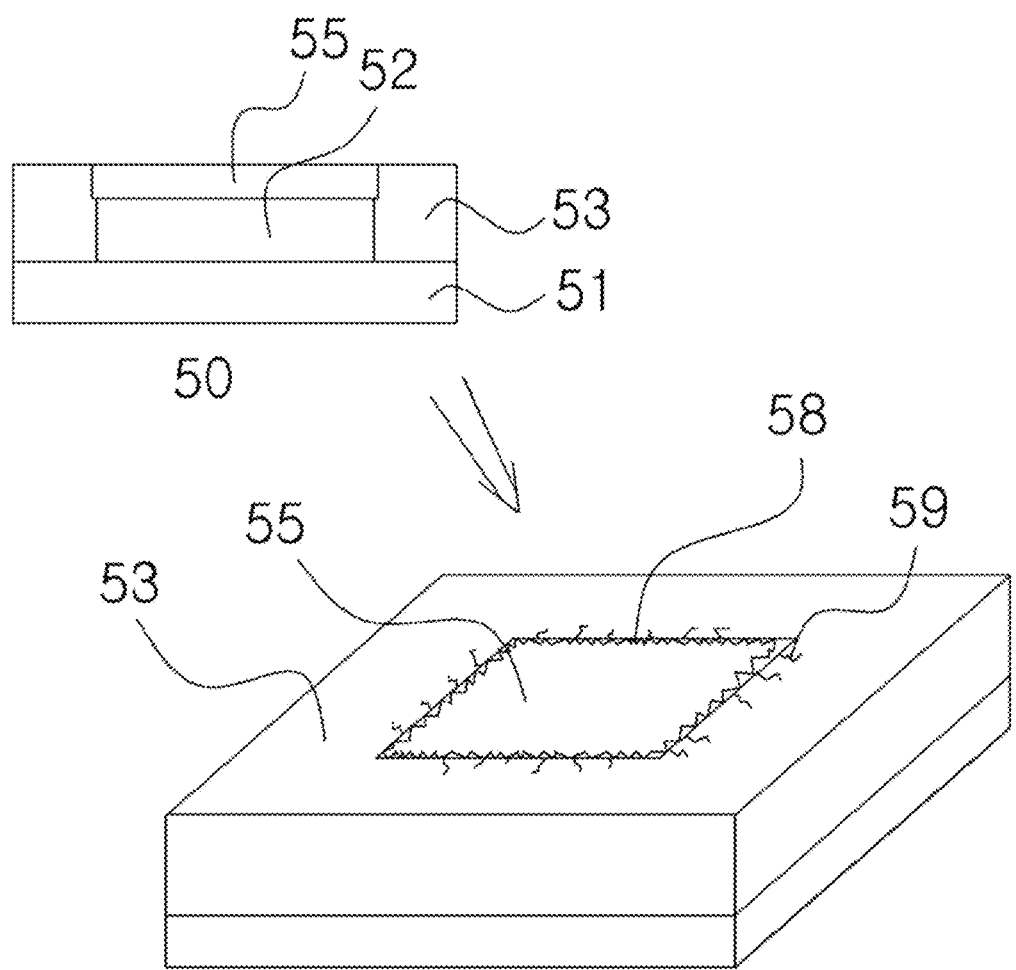
FIG. 5 is a perspective view illustrating a light-emitting diode (LED) light-emitting member to which the ceramic chip manufactured using the manufacturing method according to the related art is applied.

FIG. 1 is a schematic view of a method of manufacturing ceramic chips according to an embodiment of the present disclosure, FIGS. 2 and 3 are front views illustrating ceramic chips manufactured using the method of manufacturing ceramic chips according to the embodiment of the present disclosure, FIGS. 4A and 4B are views illustrating a comparison between a ceramic chip manufactured using a manufacturing method according to the related art and the ceramic chip manufactured using the manufacturing method according to the embodiment of the present disclosure, and FIG. 5 is a perspective view illustrating a light-emitting diode (LED) light-emitting member to which the ceramic chip manufactured using the manufacturing method according to the related art is applied. The surface roughness of ceramic chips 11, the slope of a wafer 1, and the like illustrated in the drawings may be exaggerated in regard to actual ones in terms of the scale. This is for convenience of description.

First, the phosphor wafer 1 to be divided into individual ceramic chips 11 is prepared. Although the present disclosure may be applied to various kinds of ceramic chips 11, in the present embodiment, the ceramic chips 11 as a color conversion phosphor applied to an LED light-emitting member will be described as an example. In order to utilize a blue LED as a white LED, the ceramic chips 11 based on a fluorescent layer are widely used. As disclosed in the prior art document, the wafer 1 having a disc shape may be manufactured by applying processes such as pressing, sintering, and the like to fluorescent material powder and glass powder. The wafer 1 may also be manufactured to have a quadrangular shape.

Since the wafer 1 does not have a size that can be applied to a real product, the wafer 1 should be divided into small ceramic chips 11. In addition, a surface of the wafer 1 may be rough or curved, so that it is necessary to be processed with a planarization operation.

A process <1> illustrated in FIG. 1 is a rough grinding process. As illustrated in a process <0> of FIGS. 1 and 2, in a just-manufactured wafer 1, a bottom side B supported by a support surface G may be flat but a top side T may be formed to be uneven or inclined. As illustrated in the process <0> of FIG. 2, in the just-manufactured wafer 1, a center portion is thin and a peripheral portion is thick, and thus the top side T often has a curved shape. As illustrated in the process <1> of FIG. 2, the top side T having a flat shape may be obtained by grinding the top side T with a grinder 21 in the process <1>. However, the top side T still has fine uneven portions. That is, the surface roughness of the top side T does not reach a desired level. Accordingly, a fine grinding operation is performed later to grind the top side T to be smooth.

The grinding operation may be performed using the surface grinder 21. The grinder 21 grinds the surface of the wafer 1 while a wide disc-shaped disk rotates. A thickness of the wafer 1 is gradually and uniformly reduced by performing the grinding operation. A grinding system may be constructed with a mechanical device equipped with a support configured to movably support the grinder 21, a support bed on which the wafer 1 is placed, and a control unit.

In a process <2>, the wafer 1 is turned upside down and a rough grinding operation may be performed on the bottom side B. Typically, although the bottom side B may not be formed to be inclined, this process may be selectively performed because the bottom side B may have some fine uneven portions.

A cutting operation is performed on the top side T of the wafer 1 with a dicing blade 25 in a process <3>. However, this operation is not executed to completely cut and divide the wafer 1 into small ceramic chips 11 but to form dicing trenches 17 by cutting only partial thickness as if making cuts. A plurality of straight dicing lines 13 are formed at uniform intervals throughout the wafer 1, and then a plurality of dicing lines 13 are also formed in a direction perpendicular to the straight lines. A gap between the dicing lines 13 corresponds to a width of the ceramic chip 11 to be finally cut. Immediately after performing the process <2>, the wafer 1 should be turned upside down to the original state before performing the process <3> because the wafer 1 is in a state of being turned upside down.

Here, as illustrated in the process <3> of FIG. 2, inclined portions 18 are formed on both sides of an upper end of the dicing trench 17, that is, at portions that will later form an upper portion of each of side surfaces of the ceramic chip 11. Since the surface of the wafer 1 is the foremost portion that receives the dicing blade 25 and is a boundary surface between the wafer 1 and the outside, more materials are fragmented due to the rotation of the dicing blade 25. That is, an inclined surface is formed on the surface of the wafer 1 because a portion in which a finely fragmented phenomenon occurs mainly is the surface of the wafer 1. The inclined portions 18 should be eliminated to reduce the side surface roughness of the ceramic chip 11. Since the inclined portions 18 are formed, a width of the dicing trench 17 is formed to be inclined to gradually increase toward the top side T.

Thus, in a process <4> of FIG. 1, a rough grinding operation is once again performed on an upper surface of the dicing trench 17, in which the inclined portions 18 are formed, that is, on the top side T of the wafer 1. When the rough grinding operation is completed, as illustrated in the process <4> of FIG. 2, the inclined surface is eliminated. However, the fine uneven portions are still left. In this process, when the grinder 21 that is too rough is used, it will be advantageous to eliminate the inclined surface but the surface may be rough, and when the grinder 21 that is too fine is used, the working time required to eliminate the inclined surface may be too long. The degree of roughness of the grinder 21 may be selected in consideration of the roughness required for the final product, the working time, the reliability of the equipment, and the like.

An operation of removing even the fine uneven portions to reduce the roughness to the extent that may meet the final specifications is performed in a process <5> of FIG. 1. Fine grinding is performed to maximally grind the top side T to be smooth. As illustrated in the process <5> of FIG. 2, the top side T becomes smoother after this process is performed. Of course, when the surface illustrated in the process <5> of FIG. 2 is further enlarged and viewed, a rough surface may appear again, but the fine grinding cannot be performed indefinitely. It is sufficient to finely grind the wafer until we get the roughness that meets the required needs of the final product. In some cases, the fine grinding may be performed several times by varying the degree of roughness of the fine grinder 21 to meet the required specifications. Meanwhile, when the results of the process <4> have achieved the desired roughness, the fine grinding in the process <5> may not be necessary. The rough grinding and the fine grinding are relative concepts. The roughness of the rough grinding and the fine grinding may be determined according to the characteristics of a material and the required specifications. Of course, the roughness of resultants of the rough grinding and the fine grinding will be set such that the roughness of the resultant of the fine grinding is less than that of the resultant of the rough grinding. When described in view of purpose, it can be seen that the rough grinding is performed for the purpose of reducing the roughness while substantially reducing the thickness of the wafer and the fine grinding is performed for the purpose of further reducing the roughness rather than reducing the thickness.

The wafer 1 was processed such that the wafer 1 was smooth and the dicing trenches 17 were formed, but the wafer 1 has not yet been fully separated into ceramic chips 11. In a process <6> of FIG. 1, the wafer 1 is finally divided into the ceramic chips 11. To this end, first, the wafer 1 is turned upside down. Accordingly, the top side T is directed downward and the bottom side B is directed upward. In the state that the wafer 1 is turned upside down as described above, a rough grinding operation is performed. The thickness of the wafer 1 is gradually reduced from the bottom side B by performing the rough grinding operation. When the operation continues as illustrated in FIG. 3, the grinder 21 finally reaches a deepest portion 19 of the dicing trench 17. Accordingly, as illustrated in FIG. 3 and in the process <6> of FIG. 2, the wafer 1 is finally divided into the plurality of small ceramic chips 11. The wafer 1 may be divided into the ceramic chips 11 through the process <6>. In addition, even after being divided into the ceramic chips 11, when the grinder 21 moves further downward, the thickness of the ceramic chips 11 may be further reduced. This may be continued until the desired thickness of the ceramic chip 11 is achieved. That is, through the process <6>, thickness adjustment may be completed together with the separation into the ceramic chips 11.

Meanwhile, in addition to the above process, fine grinding may be performed once again on the bottom side B in the process <6>. Accordingly, as illustrated in a process <7> of FIG. 2, the further smoothed bottom side B may be obtained. The adverse effect of the uneven portions of the side surface of the ceramic chip 11, which are generated in the cutting process, on the characteristics of the final product of the ceramic chip 11 is relatively greater than the adverse effect of the roughness of the top side T and the bottom side B on the characteristics of the final product. Thus, the final fine grinding operation on the bottom side B may be selectively applied only if necessary after the rough grinding operation on the bottom side B. This operation is a process performed after the wafer 1 is divided into ceramic chips 11. Through the above processes, as shown in FIG. 4B, the wafer 1 may be divided into the plurality of ceramic chips 11 each having smooth surfaces and particularly, smooth side surfaces.

Typically, when the dicing trench 17 is formed, a deep side of the dicing trench 17 is smoothly formed and an outer side thereof, that is, an enlarged portion illustrated in the process <3> of FIG. 2, is roughly formed. When the wafer 1 is cut into the ceramic chips 11 at once with the dicing blade 25 instead of using the method of forming the dicing trenches 17, as shown in FIG. 4A, the side surfaces of the ceramic chip 11 become very rough. These problems typically occur when performing the cutting operation by utilizing the dicing blade 25, but these problems may be eliminated by combining various processes as in the embodiment of the present disclosure.

According to the present disclosure, it is possible to eliminate a rough surface that may be generated due to a finely fragmented phenomenon occurred when a ceramic wafer is divided into a plurality of individual ceramic chips. In particular, it is possible to smooth even a side surface of the ceramic chip, which is difficult to grind with a typical grinder. Accordingly, the reliability and durability of an entire system in which the ceramic chip is installed can be improved.

While the present disclosure has been mainly described with reference to the embodiment, it will be understood by those skilled in the art that various changes and modifications of the present disclosure may be made by adding, changing, deleting, or combining elements without departing from the spirit and scope of the present disclosure as defined by the appended claims, and those are construed as being included in the spirit of the present disclosure.

What is claimed is:

1. A method of manufacturing ceramic chips, the method comprising:
    (A) forming a plurality of dicing trenches on a ceramic wafer;
    (B) removing a surface in which the dicing trenches are formed by as much as a predetermined thickness to eliminate a rough surface, which is formed on an outer side of each of the dicing trenches when the dicing trenches are formed; and
    (C) removing a surface opposite to the surface in which the dicing trenches are formed by as much as a predetermined thickness so that the ceramic wafer is individualized into a plurality of ceramic chips,
    wherein:
    the ceramic chips are color conversion members for a light-emitting diode (LED),
    the ceramic wafer is cut out using a dicing blade to form the dicing trenches,
    in order to eliminate the rough surface formed on the outer side of each of the dicing trenches, the surface of the ceramic wafer is ground by as much as a predetermined thickness with a disc-shaped grinder, and
    in order to remove a surface opposite to the surface in which the dicing trenches are formed by as much as a predetermined thickness, the opposite surface of the ceramic wafer is ground by a predetermined thickness using the disc-shaped grinder.

2. The method of claim 1, wherein, before the operation (A) of forming the plurality of dicing trenches on the ceramic wafer, a rough grinding operation is performed on a top side of the ceramic wafer, in which the dicing trenches are to be formed.

3. The method of claim 1, wherein, after the operation (C) of removing the surface opposite to the surface in which the dicing trenches are formed by as much as a predetermined thickness so that the ceramic wafer is individualized into the plurality of ceramic chips, a fine grinding operation of smoothing surfaces of the individualized ceramic chips is performed.

4. The method of claim 1, wherein the rough surface formed on the outer side of each of the dicing trenches includes an inclined portion formed on the outer side of each of the dicing trenches to be inclined so that a width of each of the dicing trenches gradually increases.

5. A method of manufacturing ceramic chips, the method comprising:
    (A) forming a plurality of dicing trenches on a ceramic wafer;
    (B) removing a surface in which the dicing trenches are formed by as much as a predetermined thickness to eliminate a rough surface, which is formed on an outer side of each of the dicing trenches when the dicing trenches are formed; and
    (C) removing a surface opposite to the surface in which the dicing trenches are formed by as much as a predetermined thickness so that the ceramic wafer is individualized into a plurality of ceramic chips,
    wherein, before the operation (A) of forming the plurality of dicing trenches on the ceramic wafer, a rough grinding operation is performed on a bottom side of the ceramic wafer.

6. A method of manufacturing ceramic chips, the method comprising:
    (A) forming a plurality of dicing trenches on a ceramic wafer;
    (B) removing a surface in which the dicing trenches are formed by as much as a predetermined thickness to eliminate a rough surface, which is formed on an outer side of each of the dicing trenches when the dicing trenches are formed; and
    (C) removing a surface opposite to the surface in which the dicing trenches are formed by as much as a predetermined thickness so that the ceramic wafer is individualized into a plurality of ceramic chips,
    wherein, after the operation (B) of removing the surface in which the dicing trenches are formed by as much as a predetermined thickness to eliminate the rough surface, which is formed on the outer side of each of the dicing trenches when the dicing trenches are formed, a fine grinding operation of smoothing the surface is performed by removing the surface in which the dicing trenches are formed once again by as much as a predetermined thickness.

* * * * *